(12) United States Patent
Chang

(10) Patent No.: US 6,396,326 B1
(45) Date of Patent: May 28, 2002

(54) HIGH VOLTAGE DRIVER HAVING OVERSHOOT/UNDERSHOOT PROTECTION CIRCUITRY

(75) Inventor: Jung-Yueh Chang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/607,253

(22) Filed: Jun. 30, 2000

(51) Int. Cl.$^7$ ................................................. H03K 5/08
(52) U.S. Cl. ........................ 327/309; 327/112; 327/546
(58) Field of Search ................................. 327/309, 310, 327/321, 328, 333, 108, 112, 545, 546; 361/89, 90; 363/18

(56) References Cited

U.S. PATENT DOCUMENTS

| | | | |
|---|---|---|---|
| 5,440,249 A | * | 8/1995 | Schucker et al. ............. 326/81 |
| 5,614,859 A | * | 3/1997 | Ong ............................ 327/333 |
| 5,764,097 A | * | 6/1998 | Whitfield .................... 327/540 |
| 6,157,223 A | * | 12/2000 | Blake .......................... 327/108 |

* cited by examiner

*Primary Examiner*—My-Trang Nu Ton
(74) *Attorney, Agent, or Firm*—Blakely, Sokoloff, Taylor & Zafman LLP

(57) ABSTRACT

A driver having a cascode stage with a common gate transistor that provides an output transmit signal at a driver output node. A protection circuit includes a resistor coupled to bias a gate of the common gate transistor to a clamp voltage. The resistor has a resistance value at least large enough to allow the gate voltage to follow some of a transition in the driver output node voltage when the driver is not transmitting. The resistance value may also be selected to delay the gate voltage from returning to the clamp voltage following the transition, so that the voltage between the gate and a source of the common gate transistor does not reach a level that can damage the common gate transistor.

30 Claims, 7 Drawing Sheets

HIGH VOLTAGE DRIVER HAVING OVERSHOOT/UNDERSHOOT PROTECTION CIRCUITRY

FIELD OF THE INVENTION

This invention is generally related to metal oxide semiconductor (MOS) digital drivers, and more particularly to circuitry that protects the driver against overshoot/undershoot voltages at the driver output node when the driver is not transmitting.

BACKGROUND

A high voltage driver can translate a digital signal from a given voltage range to a greater voltage range. An electronic device, such as a modern processor built in a MOS integrated circuit die, may use tens or even hundreds of MOS drivers, one for each of its signals, to communicate with another device or bus. High density devices such as advanced processors use a relatively low supply voltage which permits greater on-chip computing performance and lower power dissipation, both very desirable results. However, higher voltages are often needed by other types of devices and for reliable bus signaling. The high voltage driver provides the voltage translation to interface between low and high supply voltage devices.

Typically, a device uses drivers that are built on its own die to transmit and receive the high voltage signals from the second device. Certain MOS field effect transistors (MOSFETs) at the output stage of the driver are capable of operating reliably at a higher supply voltage than the rest of the die so that they may generate and withstand the higher voltages associated with the second device. In addition, these transistors also withstand voltage overshoots and undershoots (beyond the normal supply range) that appear at the output node of the driver in receive mode, when the driver is not transmitting.

In one conventional technique, the exposed driver transistors are specially designed and built to be different than the other "standard" transistors in the die, so that they may withstand the higher voltages needed to communicate with the second device. For instance, a special driver MOSFET can be designed to have a thicker gate oxide than its standard siblings on the same die. Such a solution, however, significantly increases the manufacturing cost of the die because some fabrication steps need to be modified and/or added to build the special transistors.

Another limited solution is to use standard transistors for the drivers, and add a pair of diodes to limit the output node voltage of each driver. In the presence of an undershoot, for instance, the node voltage is clamped to no lower than one diode drop (approximately 0.7 Volts) below the lower supply node voltage (e.g. ground). However, a 0.7 Volt diode drop may stress or damage the relatively thin gate-oxide of standard MOS transistors that are typically built using advanced fabrication processes for operation at very low supply voltages. In these fabrication processes, the gate oxide of a standard MOSFET may tolerate a small voltage, e.g. for a supply of 1.8 Volt, the maximum voltage across the gate oxide may be no more than 0.27 Volts greater than the 1.8 Volt supply. Thus, diodes by themselves are not suitable to protect high voltage drivers built with standard transistors in such processes.

Yet another limited solution uses a clamp consisting of a pair of MOSFETs biased in their sub-threshold regions of operation, rather than the diodes. Although the sub-threshold biased MOSFETs can provide enough protection only when their widths are large enough to prevent voltage build up at their drain causing electrical-over-stress, a large device biased at sub-threshold will introduce a significant amount of leakage current which may not be desirable in many applications. In addition, their sophisticated bias circuits may also consume a relatively large amount of on-chip area.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

To overcome the disadvantages of conventional techniques mentioned above, the driver according to an embodiment of the invention may be equipped with a compact protection circuit which includes a resistor coupled to bias a gate of at least one common-gate transistor to a clamp voltage. The common-gate transistor is part of a cascode output stage of the driver. When the driver is not transmitting, an output node of the driver, and thus a source electrode of the common-gate transistor, may be subjected to large voltage swings which may include overshoot and undershoot such as when receiving a signal. The resistance of the resistor is selected to be of a relatively large value to allow for capacitive coupling between the gate and source electrodes of the transistor. In other words, the resistance should be at least large enough to allow the gate voltage of the transistor to follow some of a signal transition between different logic states in the driver output node voltage. In addition, the resistance value is selected so as to delay the gate voltage from returning too quickly to the clamp voltage, following the transition. In this manner, the voltage between the gate and the source of the common-gate transistor may not reach a level that may damage the gate-oxide of the transistor. By adding a clamp to limit the downward swing of the gate voltage, and a pass transistor in parallel with the resistor to select between transmit and receive, a protection circuit that is both physically compact and that may protect the relatively thin gate-oxides in a cascode output of a driver may be built using a low supply voltage integrated circuit fabrication process.

Figure 1:
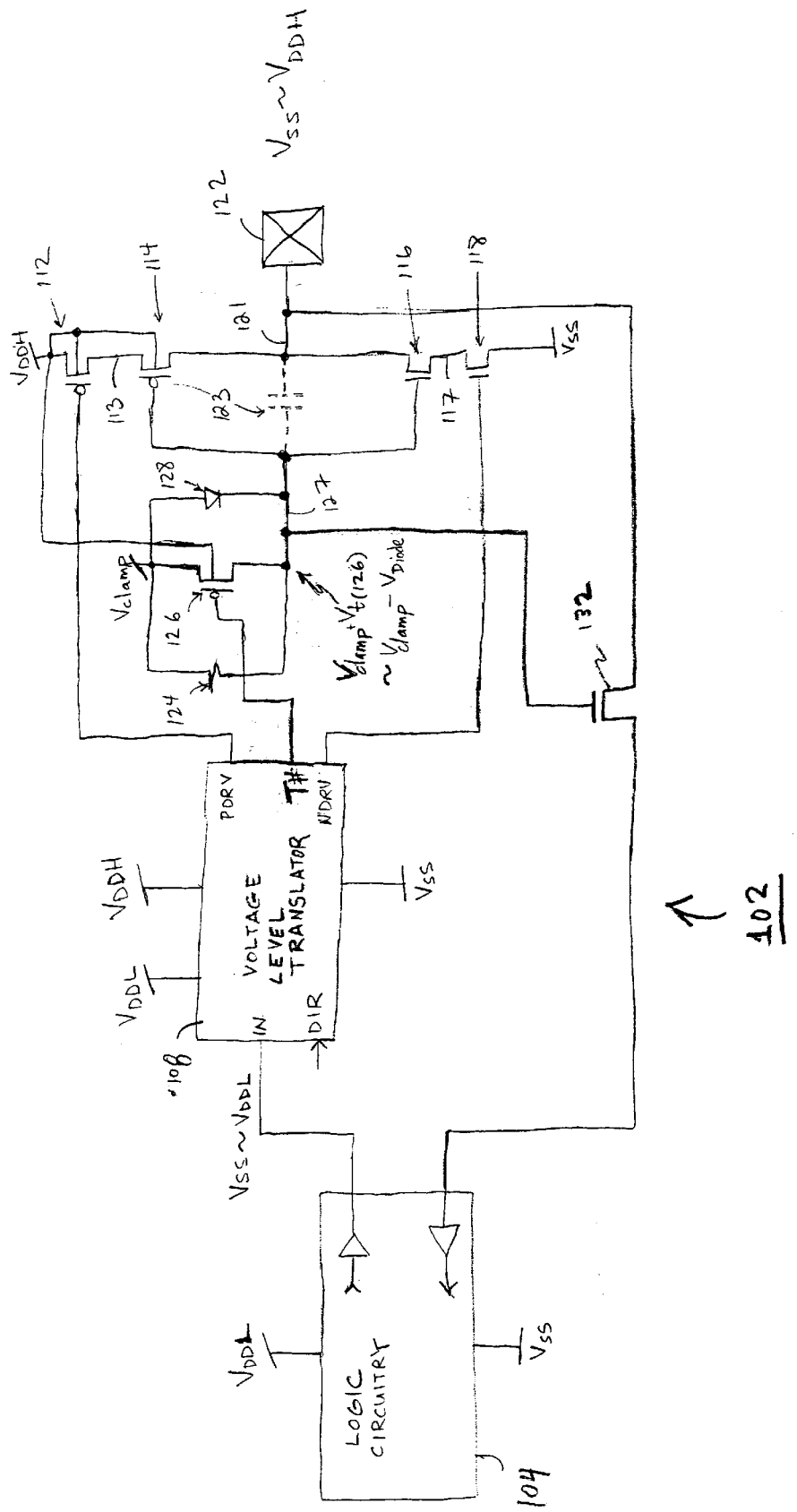
FIG. 1 illustrates a circuit schematic of a driver according to an embodiment of the invention.

FIG. 1 illustrates a circuit schematic of a driver 102 according to an embodiment of the invention. The driver features a cascode stage having MOSFETs 112 and 114 (p-channel) and 116 and 118 (n-channel). In this embodiment, a complimentary MOS (CMOS) implementation is shown in which the p-channel transistors 112 and 114 have their bulk connections shorted to an upper supply node at a voltage $V_{ddh}$. The n-channel transistors 116 and 118 are built in a p-substrate that may be shorted to a return node at voltage $V_{ss}$. In most applications, $V_{ss}$ is considered to be at zero volts (ground) whereas $V_{ddh}$ is at a higher (here, positive) voltage.

In the cascode stage, the transistors 116 and 114 are connected in a common-gate configuration which provides good high frequency response. The source terminals of these two transistors are shorted at node 121 which acts as the driver output node for this embodiment. When the driver is transmitting, an output transmit signal generated by the cascode stage may appear at node 121. As an alternative, there may be series resistors included between the node 121 and the respective source terminals of transistors 114 and 116, for purposes of, for instance, protecting against electrostatic discharge that might appear on the node 121.

The gate terminals of the two transistors 114 and 116 may be shorted at a node 127. In an alternative embodiment, the gates need not be shorted, although such an alternative may prove to be less compact (See FIG. 6, for instance). The protection circuit is coupled to bias the gates of these transistors in such a way as to protect their gate-oxides against the high voltage transitions and overshoot/undershoot presented at the node 121 when the driver is not transmitting. Details of the protection circuit are discussed below.

The driver 102 includes a voltage level translator 108 that may be designed to operate based upon two different supply nodes, one at $V_{ddl}$ and another at $V_{ddh}$, where $V_{ddh}$ is higher than $V_{ddl}$ when compared to $V_{ss}$. The voltage level translator may be designed according to conventional techniques to translate, including level shift and/or scale, a transmit signal at the input node to generate first and second translated transmit signals at the NDRV and PDRV outputs. These transmit signals should be capable of cutting off and fully opening the channels of the transistors 112 and 118. For instance, the transmit signal at the input node may exhibit logic transitions between $V_{ss}$ and $V_{ddl}$ which are translated into corresponding transitions at PDRV of $V_{ddl}$ to $V_{ddh}$. The voltage level translator 108 may feature a conventional level shifter and a pre-driver to translate the input into the output PDRV. For instance, considering the case where $V_{ddl}$ is at 1.8 volts and $V_{ddh}$ is at 3.3 volts, the level shifter may produce a digital signal in the range 1.8 volts to 3.3 volts at the output PDRV.

The corresponding transitions in the NDRV output may be the same as those in the input transmit signal, i.e. $V_{ss}$ to $V_{ddl}$. Although in the particular example shown in FIG. 1, the first translated transmit signal at the output NDRV may have essentially the same range as the input transmit signal, there may be other types of cascode stages which require a different voltage range at their low side inputs in comparison to the input transmit signal.

The protection circuit according to an embodiment of the invention is now described. The driver 102 may operate in at least two modes, a transmit mode in which node 121 may be driven by the cascode stage, and a non-transmit (e.g. receive) mode in which node 121 may be "driven" by conventional receiving circuitry (not shown) within logic 104. When transmitting, the voltage level translator 108 pulls its T# output low towards $V_{ss}$, which results in fully opening the channel of p-channel MOSFET 126. This transistor is coupled in parallel with a resistor 124 and a diode 128 to form the protection circuit. When the channel of transistor 126 is opened, node 127 may be strongly biased to essentially $V_{clamp}$. $V_{clamp}$ may be selected to enable transmission through the cascode stage, by causing the common-gate transistors 114 and 116 to be biased in their active regions allowing each to act as a common-gate amplifier. The inputs to these common-gate amplifiers are provided by the drain nodes of transistors 112 and 118. These latter transistors, connected in a common source configuration for high gain, are driven by their respective translated transmit signals from PDRV and NDRV of the voltage level translator 108. Thus, when T# is asserted, a transmit signal in the range $V_{ss}$ to $V_{ddl}$ at the input of the voltage level translator 108 may be driven, at high gain and low output impedance, on node 121 (the driver output node) to a greater range $V_{ss}$ to $V_{ddh}$.

The greater voltage range available at the node 121 may present a problem for the transistors in the cascode stage as well as for a receive transistor 132 (to be discussed below in connection with FIG. 7), if such transistors are designed to operate at a supply voltage of no greater than $V_{ddl}$. In particular, the gate-oxide of such a transistor may be damaged by repeatedly being subjected to a voltage larger than $(V_{ddl}-V_{ss})$. In addition, overshoot and undershoot in the received signal at node 121 will further increase the voltage to which these gate oxides are subjected, thus further increasing the risk of damage to these transistors. A beneficial effect of the protection circuit may be to allow capacitance coupling to limit the voltage across the gate oxide of the devices used in the cascode stage and in the receiver transistor 132. In a particular embodiment, the protection circuit is implemented with the resistor 124, the pass transistor 126, and the diode 128. Its detailed function may be explained using a partial dc equivalent circuit for the cascode stage, as shown in FIG. 2.

Figure 2:
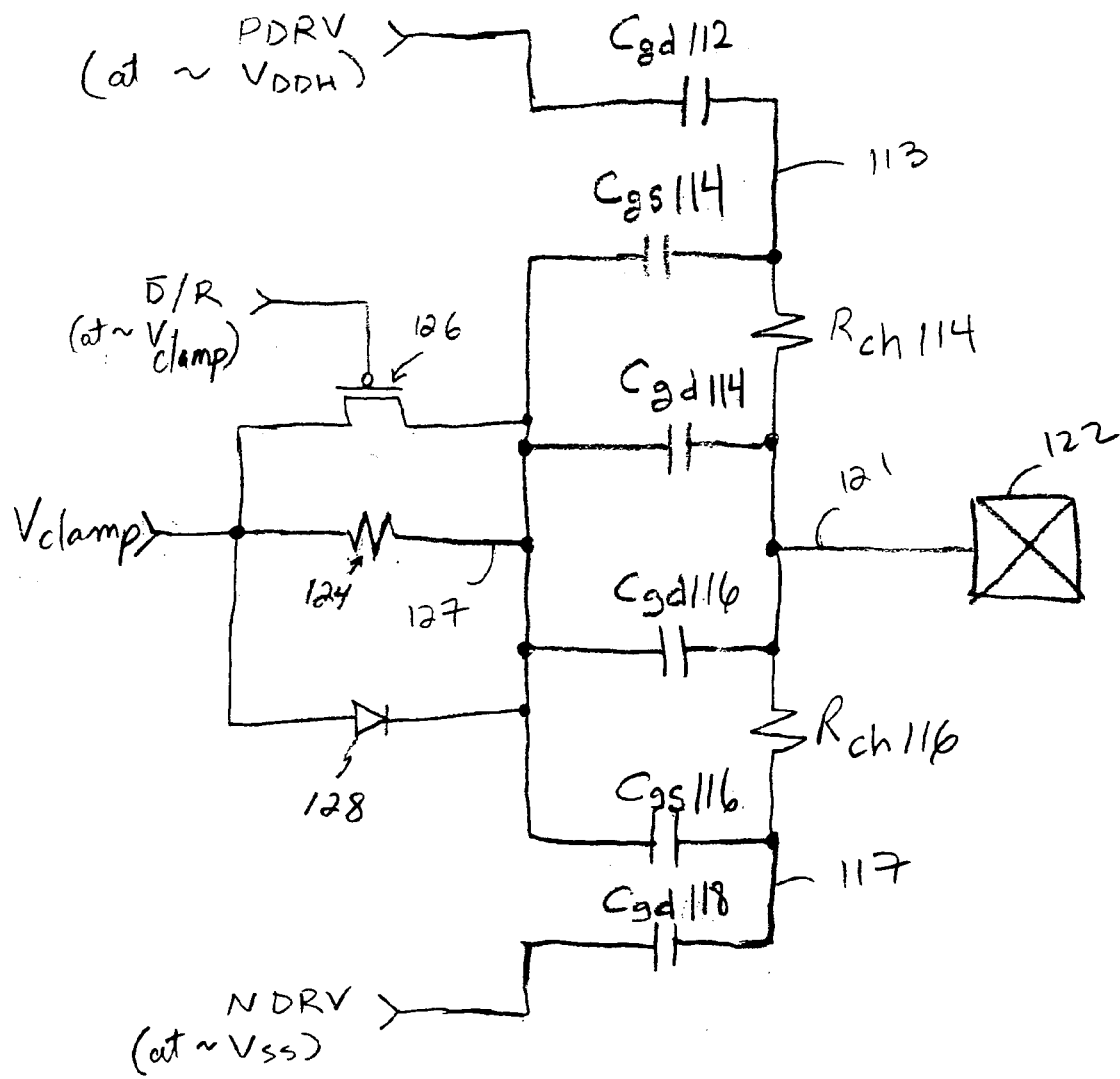
FIG. 2 shows a partial dc equivalent circuit for the driver, when not transmitting.

Referring now to FIG. 2, this circuit may help identify the maximum voltages to which the gate oxides of the transistors in the cascode circuit may be subjected during transitions at the node 121 which may include signal overshoots and undershoots. This circuit is for the situation in which the driver is not transmitting, i.e. the gate of pass transistor 126 has been strongly pulled up to $V_{clamp}$ such that the node 127 is weakly biased through resistor 124. The parasitic gate to source and gate to drain capacitance for each of the transistors 112, 114, 116 and 118 are shown. The channel resistances of transistors 112 and 118 are not shown, because these channels are essentially cutoff when the driver is not transmitting. The channel resistance in transistors 114 and 116 may be relatively small or large depending upon the voltage at the node 121 (see FIG. 4 and FIG. 5, discussed below). Thus, FIG. 2 shows that the parasitic gate to drain and gate to source capacitance of the transistors in the cascode stage create a type of voltage divider between node 121 and the drain of transistor 118 (at essentially $V_{ss}$) and the drain of transistor 112 (at essentially $V_{ddh}$).

Figure 3:
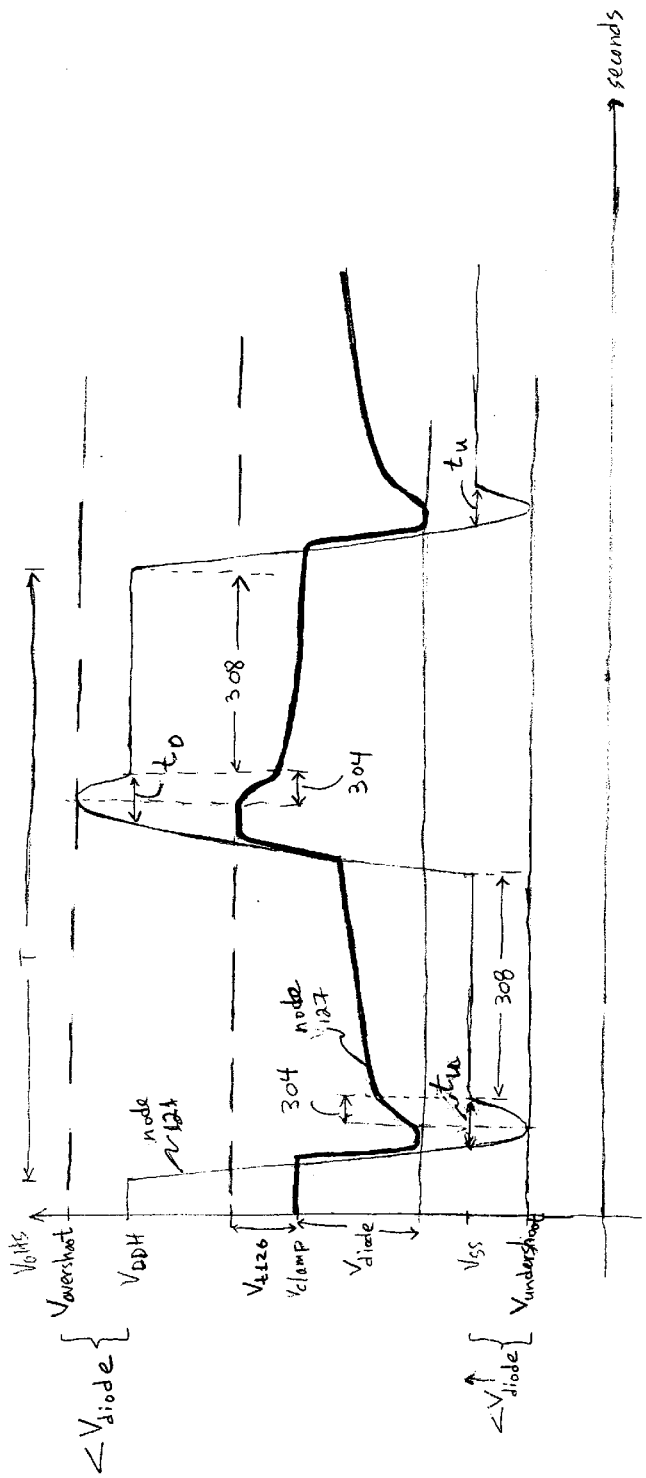
FIG. 3 illustrates a timing diagram of relevant signals in the driver including overshoot and undershoot at the output node, when the driver is not transmitting.

Referring now to the timing diagram of FIG. 3, the expected voltage levels to which node 127 and 121 are subjected during transitions at the node 121 are described. The waveforms start with node 121 at approximately $V_{ddh}$ (e.g. a logic high level). Node 127 at this point is at a predetermined $V_{clamp}$ which may, for instance, be at the midway level between $V_{ss}$ and $V_{ddh}$. As node 121 transitions towards $V_{ss}$ and its undershoot value, the voltage of node 127, originally at $V_{clamp}$, now follows downwards, due to the capacitive coupling between node 121 and 127 through $C_{gd114}$ and $C_{gd116}$ which are the parasitic capacitors of transistors 114 and 116, respectively (see FIG. 1). In this way, the difference between the voltages at nodes 121 and 127, which is a close measure of the voltage across the gate oxides of transistors 114 and 116, is limited during the downward transition to roughly the difference between ($V_{clamp}-|V_{diode}|$) and $V_{undershoot}$, because the diode will turn on when node 127 is lower than $V_{clamp}-|V_{diode}|$. A reason why the voltage at node 127 should partially follow the drop in the voltage at node 121 is to insure that, once again, the difference between these two node voltages does not subject the gate oxide to more than its maximum possible voltage, to avoid damaging the gate oxide. Thus, if node 127 were to not follow the drop in the voltage at node 121, the gate oxide may be overstressed by the relatively large voltage difference between $V_{clamp}$ and $V_{undershoot}$. Similarly, when node 121 transitions from $V_{ss}$ to $V_{overshoot}$, the voltage at node 127 follows rather than remain at or below $V_{clamp}$.

Although the node 127 initially follows the transition in node 121, the voltage at node 127 is limited in its downward and upward swing by a clamp such as a diode and by the pass transistor 126 (acting as a diode when T# is deasserted and biased at voltage $V_{clamp}$), respectively. Thus, as shown in FIG. 3, the voltage at node 127 is limited to no lower than a diode drop $V_{diode}$ less than the clamp voltage during a downward swing, and limited to no more than the clamp voltage plus the threshold voltage of the transistor 126, $V_{t126}$. A reason for limiting the downward swing at the node 127 is to protect the gate oxide of the pass transistor 126, because the gate node of this transistor is at $V_{clamp}$ when the driver is not transmitting, such that allowing the voltage at node 127 to drop substantially below $V_{ss}$ may overly stress the gate oxide of the transistor 126.

The limiting effect at node 127 during the upward transition may be a result of using a p-channel device for the transistor 126 whose gate is fixed at $V_{clamp}$ during receive mode. The limiting effect protects the transistor 126 from gate oxide overstress, by limiting the voltage across the gate oxides of transistors 114 and 116 to roughly no more than $V_{ddh}-V_{clamp}-|V_t|$ (where $V_t$ is the threshold voltage of the transistor 126) since the transistor 126 will leave cut off and turn on when the voltage of node 127 is higher than $V_{clamp}+|V_t|$.

To protect the transistors 114 and 116 during undershoot and overshoot, the time interval 304 associated with the recovery of node 127 immediately after an undershoot or overshoot should be sufficiently long so that node 127 does not recover too quickly (towards $V_{clamp}$) during the undershoot or undershoot times $t_u$ and $t_o$, else the gate oxides are overstressed. It should be noted that this time interval 304 may be determined by both the resistance value of the resistor 124 as well as by the total capacitance exhibited at node 127, where this capacitance may include parasitic capacitors $C_{gd\ 114}$ and $C_{gd\ 116}$ as well as an optional discrete capacitor 123. In general, to adequately couple node 121 to node 127, the capacitance between these nodes should be a substantial portion of the total capacitance exhibited at node 127.

Protecting the transistors 114 and 116 following the undershoot or overshoot interval should also be considered. In this interval 308, node 121 is in a quiescent state, while node 127 is recovering towards $V_{clamp}$. The rate of recovery towards $V_{clamp}$ may be determined in part by the resistance value of resistor 124. If this resistance is too large, than recovery towards $V_{clamp}$ may not be sufficiently stable such that the node 127 may float to a dangerously low or high level in comparison to node 127. This resistance value should be sufficiently low as to eliminate noise susceptibility of node 127, in the presence of leakage currents that might cause it to essentially float to an unpredictable and potentially problematic level. For instance, the node 127 should not be allowed to float above $V_{clamp}$ when node 121 is at $V_{ss}$. Similarly, node 127 should not be allowed to float below $V_{clamp}$ when node 121 is at $V_{ddh}$.

Another consideration for the protection circuit shown in FIG. 1 is the setting of the threshold voltage $V_{t126}$. Referring now to the timing diagram of FIG. 3, it can be seen that during the upward transition of node 121 from $V_{ss}$ to $V_{overshoot}$, node 127 initially follows but then is limited to $V_{clamp}+V_{t126}$. Thus, the value of $V_{t126}$ should be designed (such as by dimensioning the transistor 126 or by connecting its bulk to an appropriate bias level) so that it is not set at too low a level. Otherwise, during the relatively fast upwards transition of node 121, there may be a risk that the voltage difference between node 121 and node 127 exceeds the maximum permitted for the gate oxide of the transistors 114 and 116. Thus, $V_{t126}$ should be designed in view of how fast the signal at node 121 transitions upwards as well as the expected range of $V_{overshoot}$, so that the ceiling for node 127 above $V_{clamp}$ is not set too low.

Figure 4:
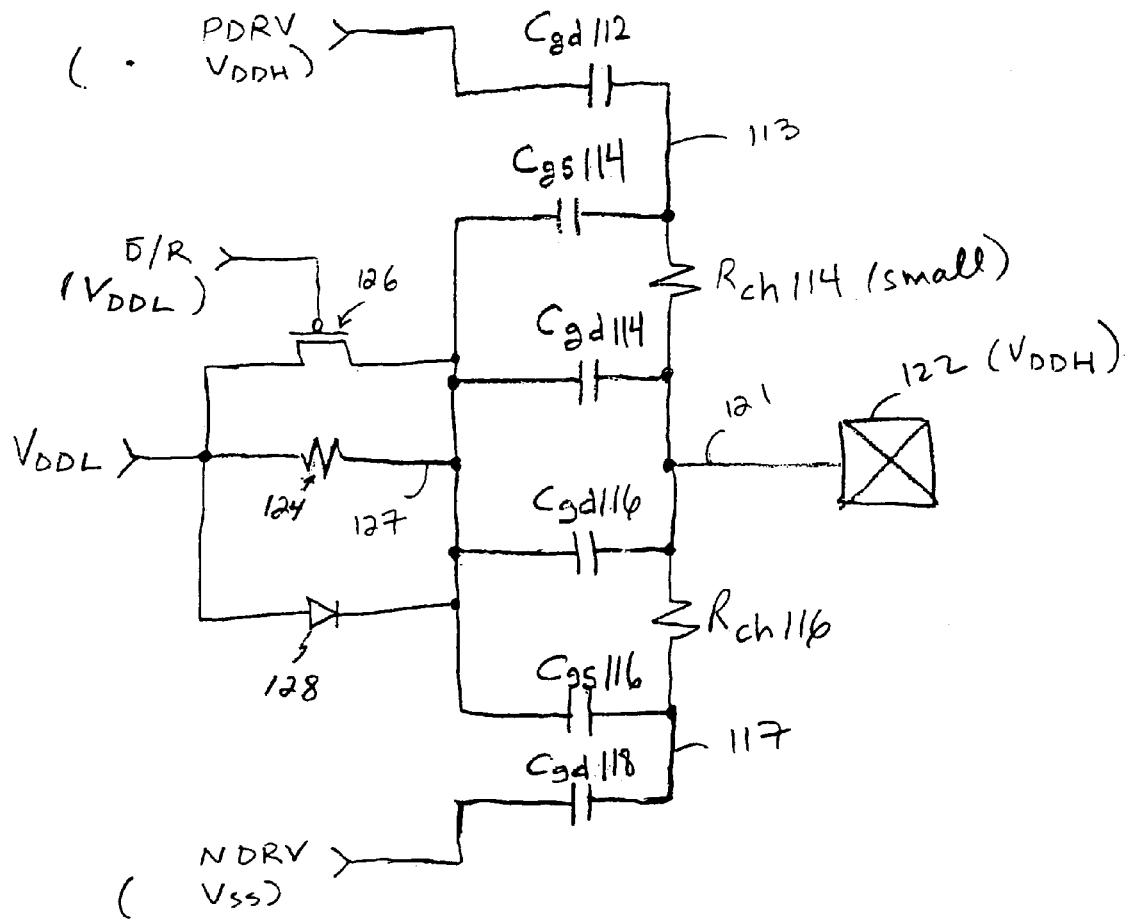
FIG. 4 shows a partial dc equivalent circuit for the driver when not transmitting, where the pad is at $V_{ddh}$.
Figure 5:
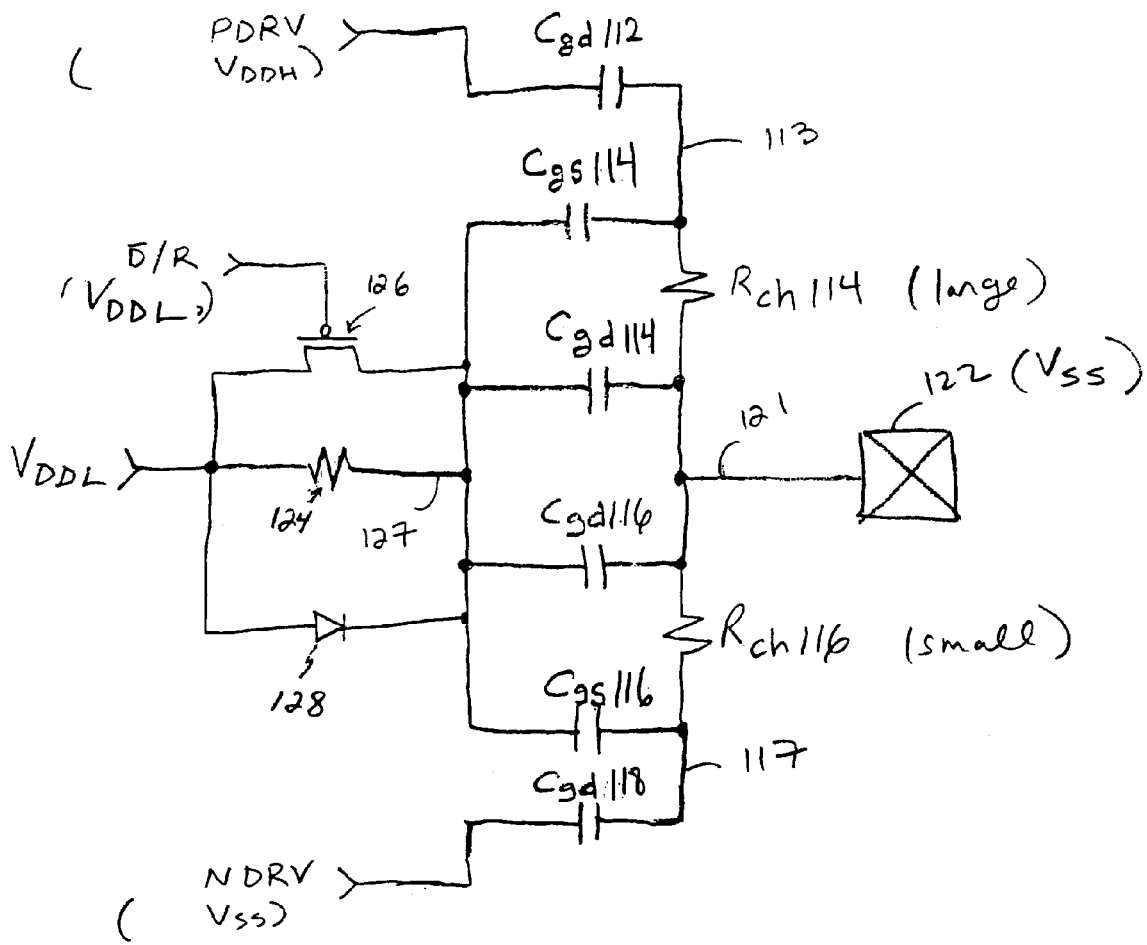
FIG. 5 shows a partial dc equivalent circuit of the driver when the pad is at $V_{ss}$.
Figure 9:
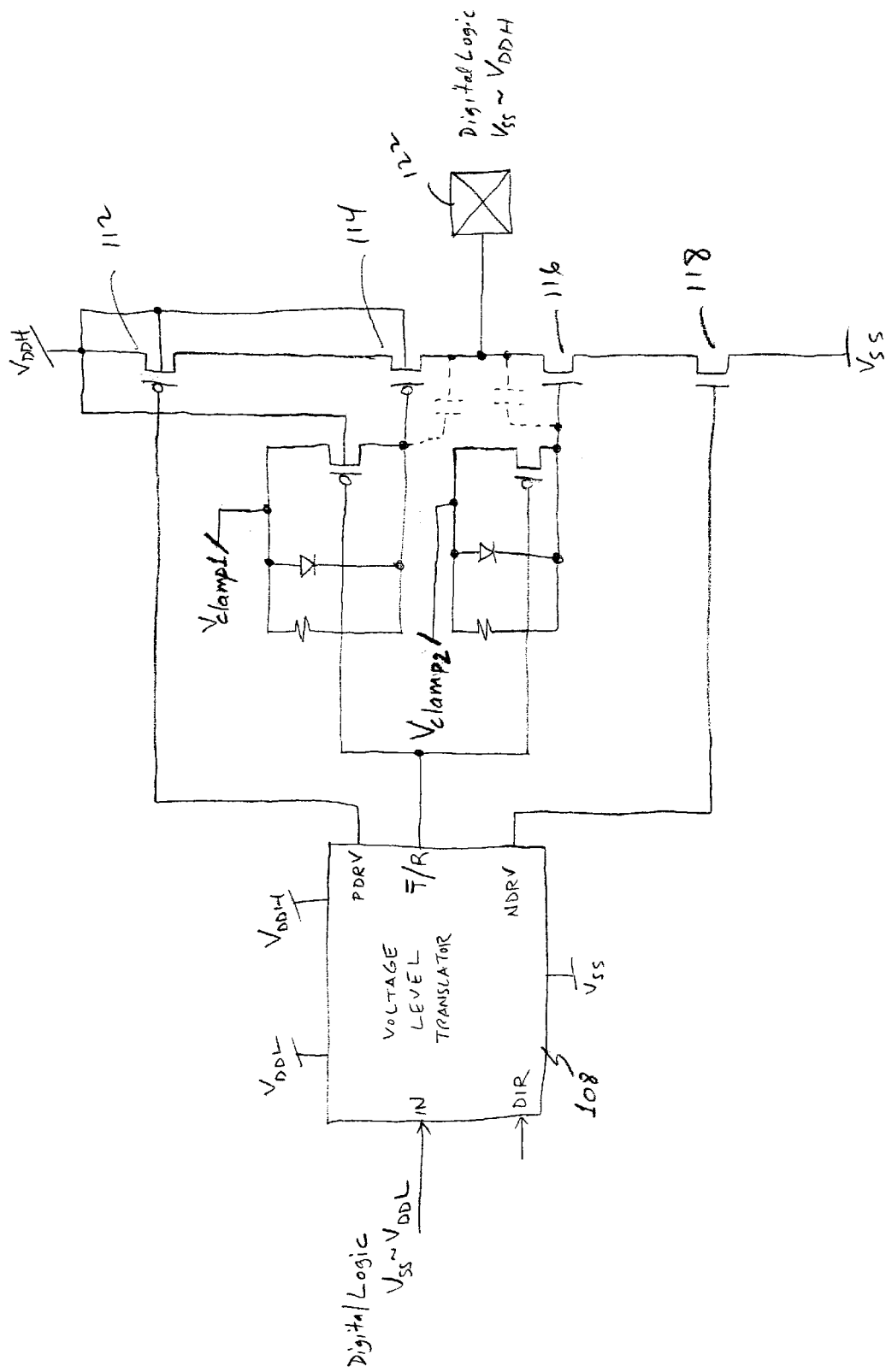

FIG. 4 and FIG. 5 illustrate in further detail how the gate oxides of transistors 114 and 116 may be protected while the output node 121 is at a high level (e.g. $V_{ddh}$) and at a low level (e.g. $V_{ss}$). The following discussion will not specifically refer to receive transistor 132, because this transistor has its gate shorted to node 127 and its drain shorted to node 121, in the same way as transistor 116. The source terminal of the receive transistor 132 is connected to an input buffer or sense amplifier for example (not shown) to receive the incoming signal. Thus, the protection mechanisms for transistor 116 also apply to transistor 132 such that if transistor 116 is adequately protected then so is transistor 132. Beginning with FIG. 4, when the output node 121 is at $V_{ddh}$, the channel resistance for transistor 114 may be relatively small, due to node 127 being weakly biased at $V_{ddl}$, where $V_{ddl}$ may be ½ of $V_{ddh}$. At the low side of the cascode stage, the channel resistance of transistor 116 is relatively large because transistor 116 is an n-channel device and its gate (node 127) is at a sufficiently low voltage with respect to its source as to insure the transistor is cutoff. In such a scenario, the voltage between nodes 127 and 117 may be no greater than $V_{ddl}$ (even assuming that we can allow node 117 to float all the way down to $V_{ss}$), so that the gate oxides of transistors 116 and 118 are subjected to no more than $V_{ddl}-V_{ss}$ which is within their tolerance range. At the high side of the cascode stage, the voltage between nodes 127 and 113 may at most be $V_{ddh}-V_{ddl}$, which is the maximum gate oxide voltage that transistors 112 and 114 may see.

Referring now to FIG. 5, a dc equivalent circuit of the cascode stage where node 121 is now at the quiescent low level at $V_{ss}$ is shown. With node 121 at $V_{ss}$, the channel resistance of transistor 114 is relatively large due to this transistor being placed in cutoff by virtue of its positive gate to source voltage (node 127 to node 121). On the other hand, the channel resistance of transistor 116 may be relatively small due to its positive gate to source voltage (node 127 to node 121). Once again, the voltage between node 121 and the gate of transistor 118 and the gate of transistor 112 is distributed across a type of voltage divider network, so that the gate oxides of all transistors in the cascode stage are subjected to a voltage no greater than $V_{ddl}-V_{ss}$ or $V_{ddh}-V_{ddl}$. Therefore, the foregoing discussion provides an explanation for how the transistors in the cascode stage, as well as the pass transistor 126, may be protected in view of the high voltage signals that are present at the output node 121. Note that a conventional power-up sequencing circuit (not shown) may be needed to bring $V_{clamp}$ up to a suitable level before $V_{ddh}$ reaches its peak, to avoid stressing the cascode stage transistors.

Figure 6:
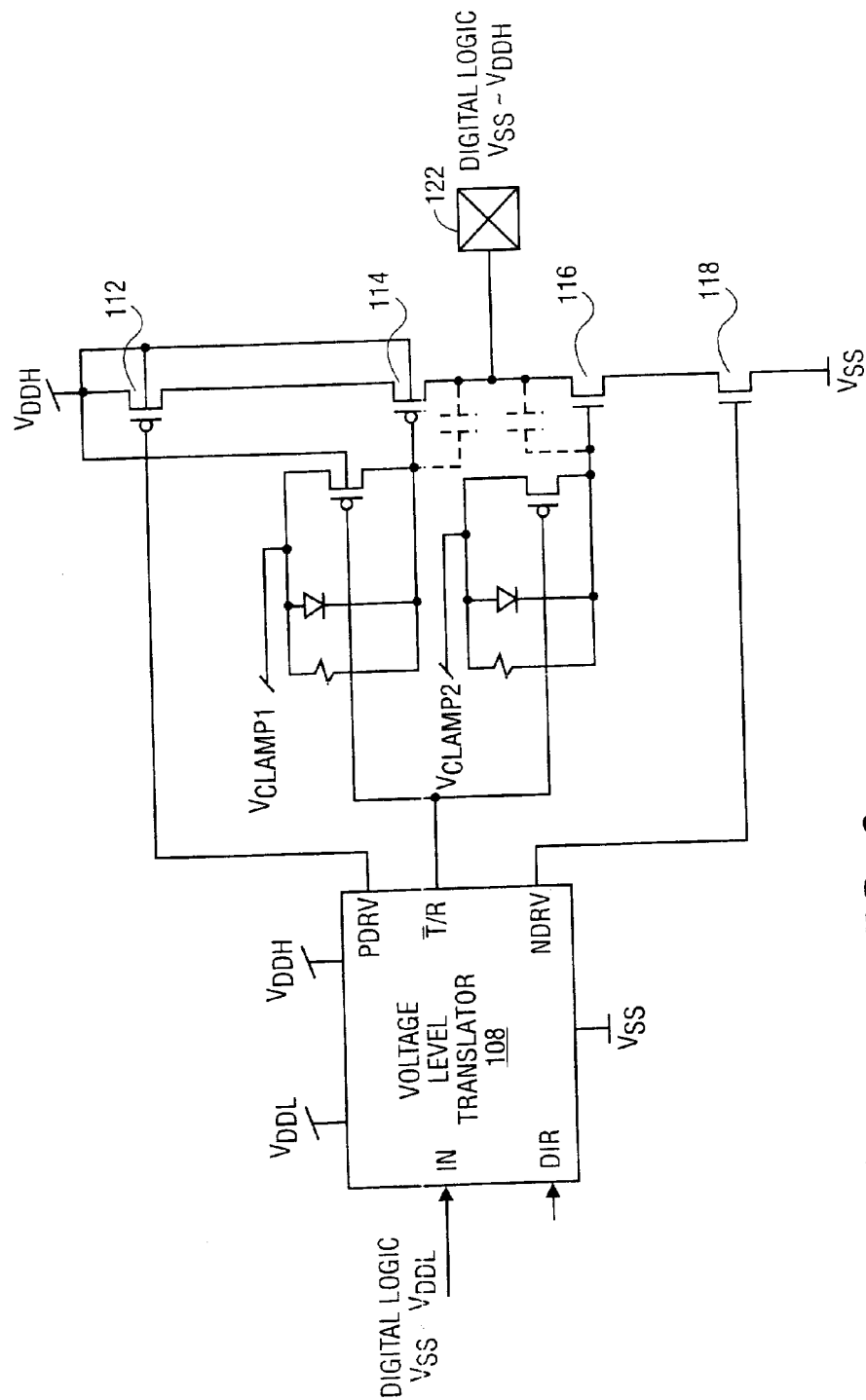
FIG. 6 depicts a schematic of another embodiment of the driver.
Figure 7:
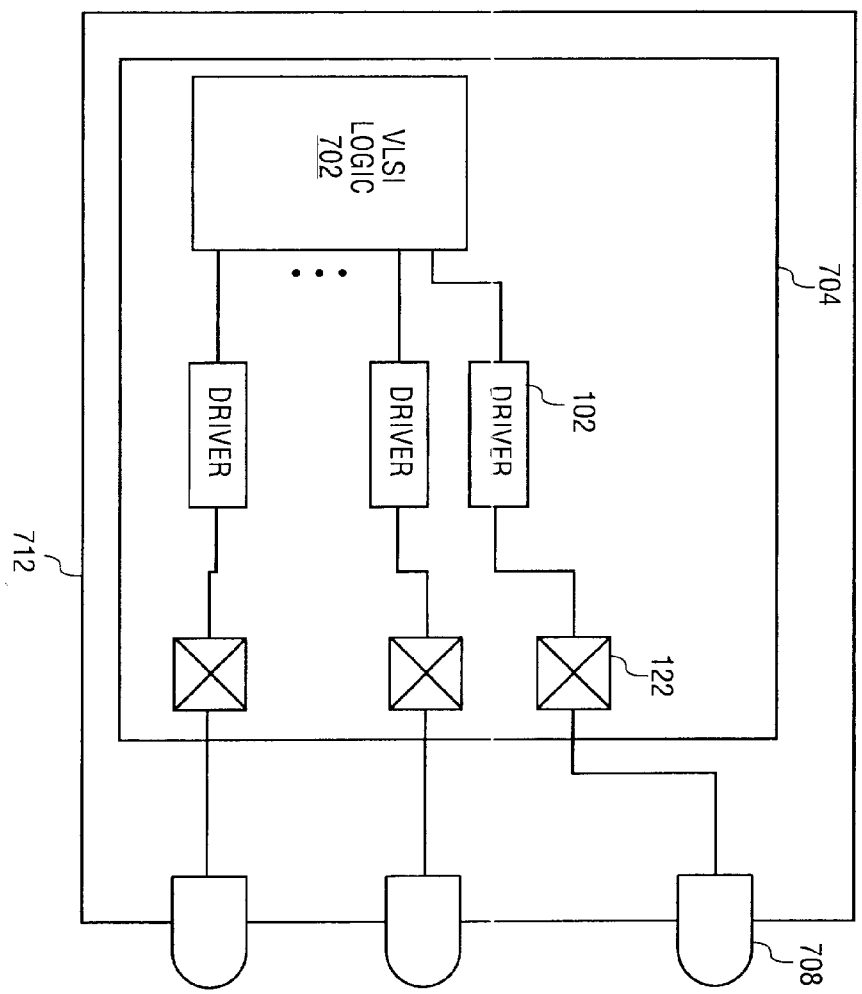

FIG. 6 illustrates an alternative embodiment of the driver where in this case the gate electrodes of transistors 114 and 116 are not shorted together. Instead, each gate node receives a separate protection circuit substantially identical to that described above in FIG. 1. The operation of this driver is substantially the same as the one in FIG. 1, except that there may be separate clamp voltages applied to each gate of the common gate transistors 114 and 116. This additional flexibility, however, may come at the greater expense of increased physical space due to the second protection circuit.

Figure 7:
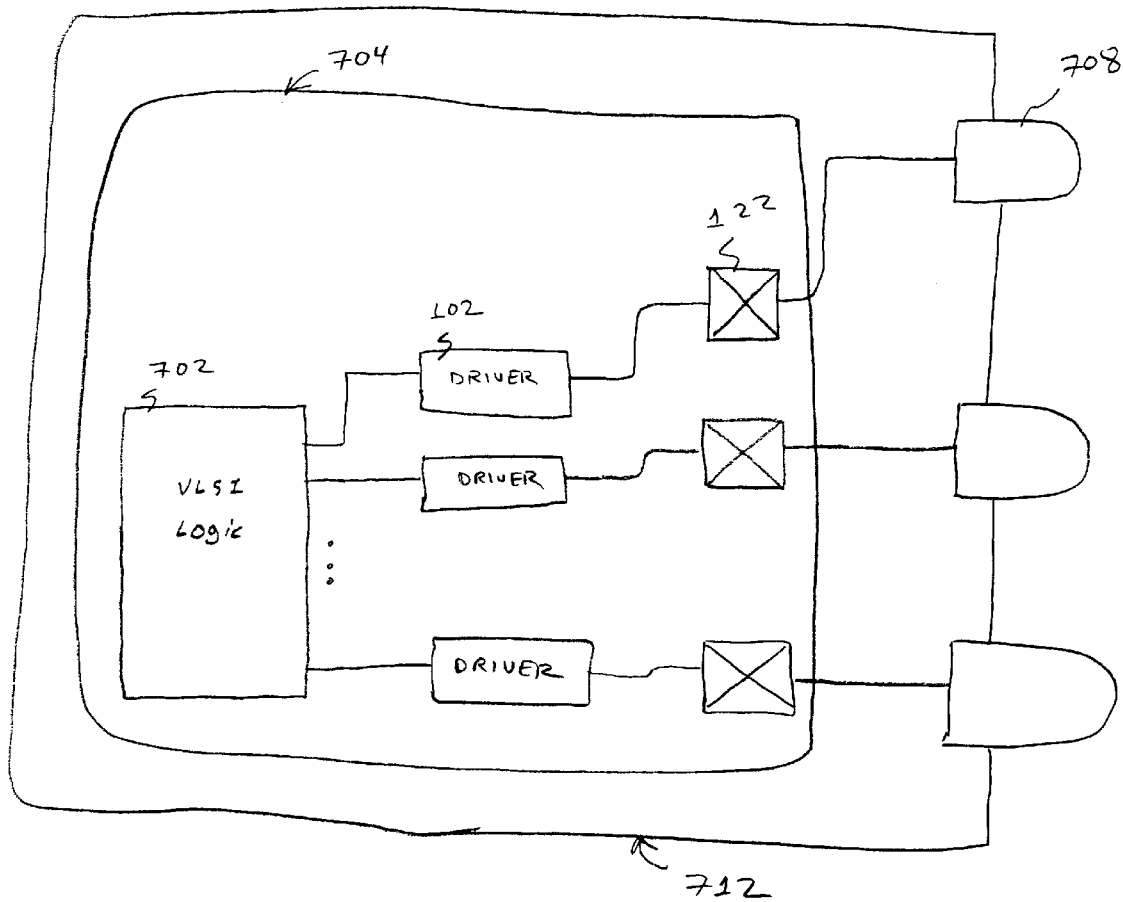
FIG. 7 illustrates a block diagram of an integrated circuit package embodiment.
Figure 1:
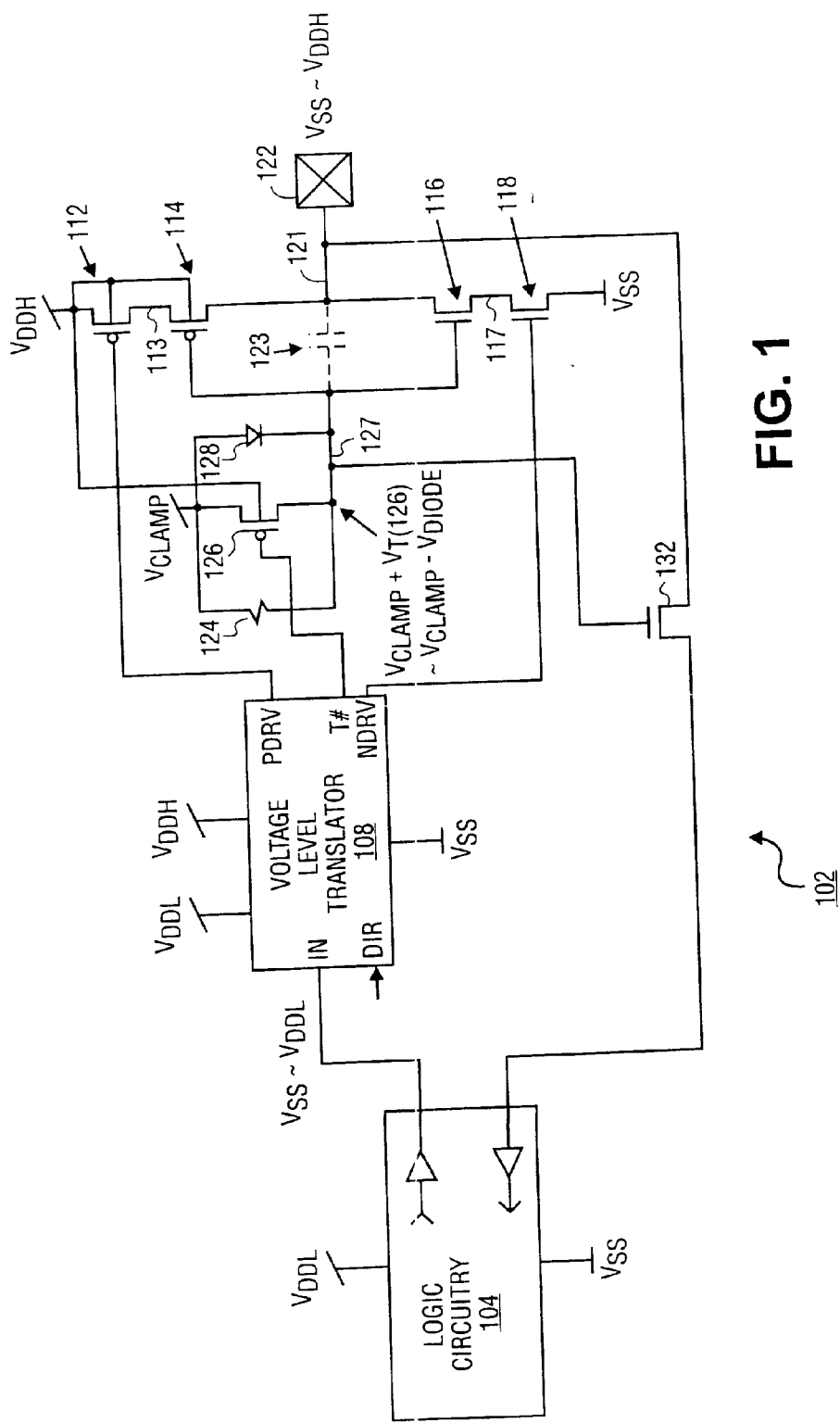
Figure 2:
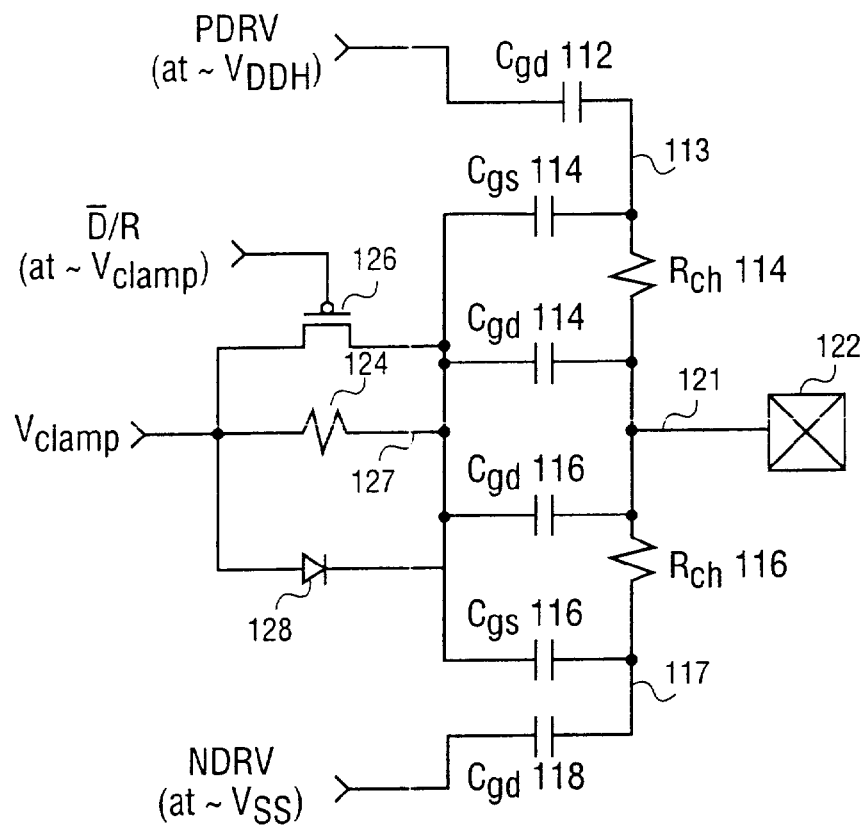
Figure 3:
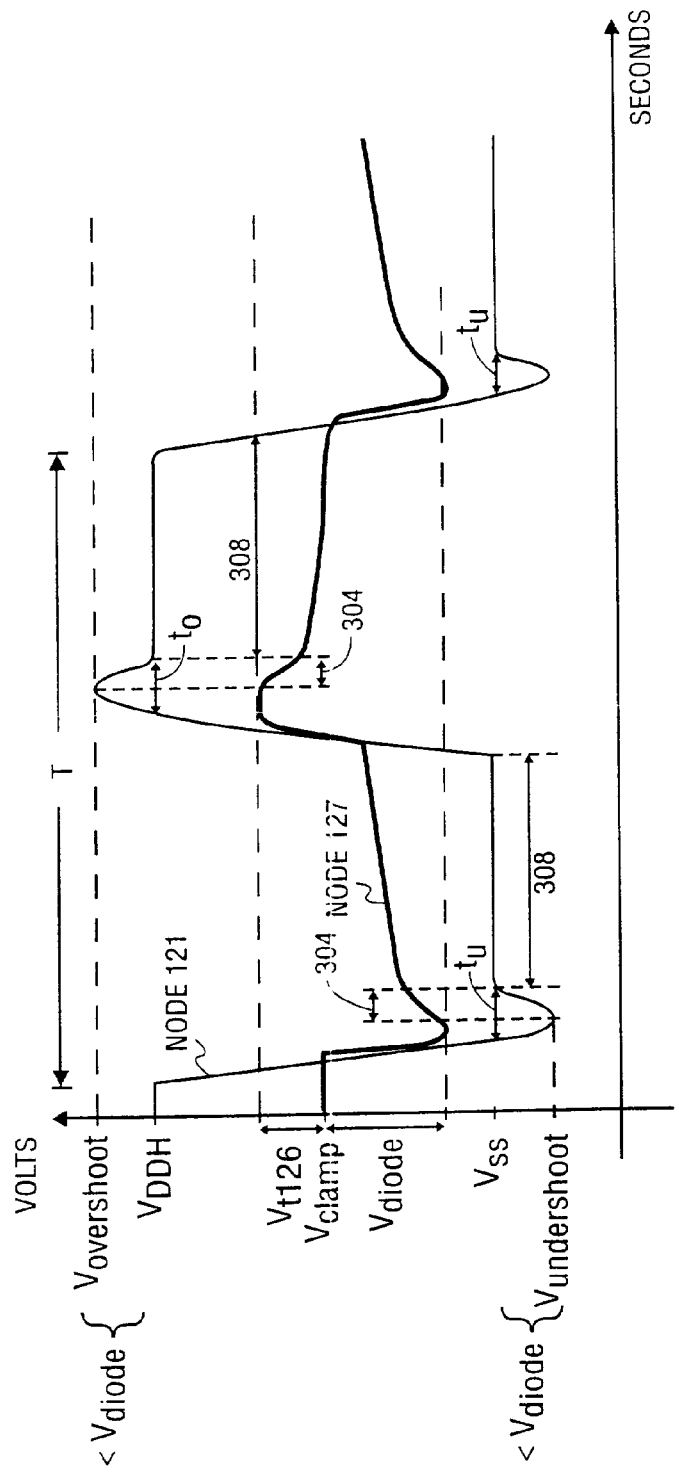
Figure 4:
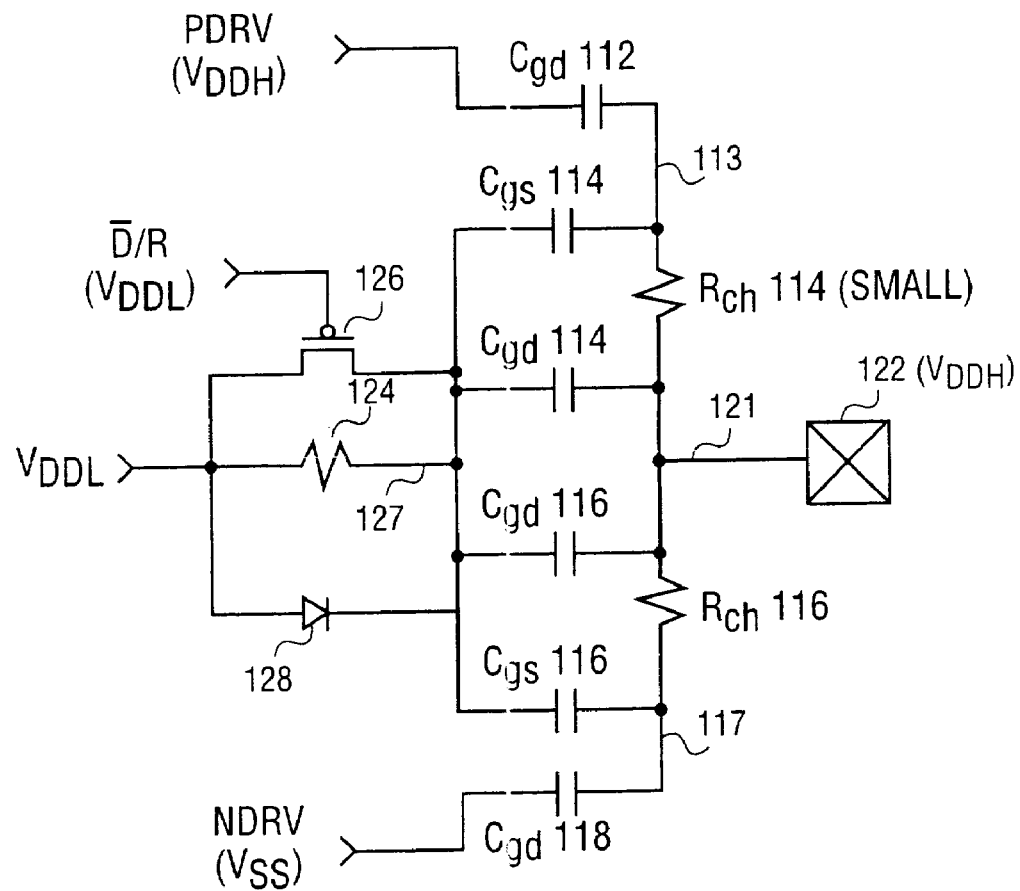
Figure 5:
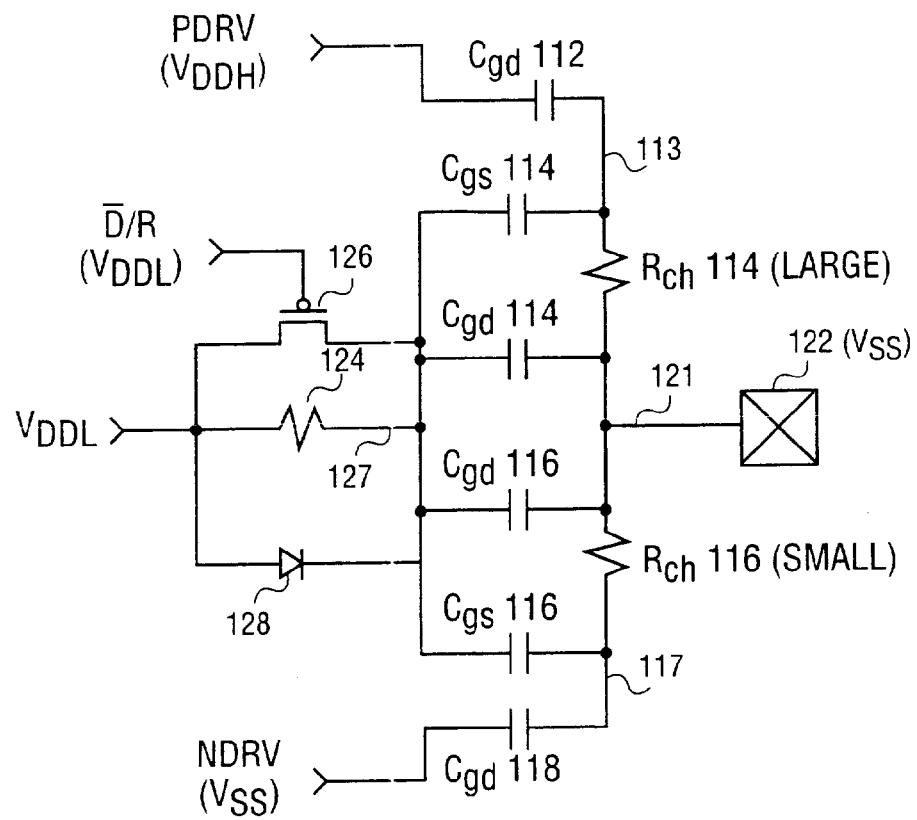

The above described embodiments of the driver are particularly useful as integrated circuit pad drivers, where node 121 is coupled to a pad 122 as shown in the figures. This embodiment is depicted in FIG. 7. Each pad 122 provides for an electrical signal connection between very large scale integration (VLSI) logic 702 in an IC die 704, and a metal terminal 708 in an integrated circuit package 712 that contains the die 704. The pad 122 is thus formed in the same die 704 as the driver 102. The VLSI logic may implement a processor or other communication or computing device. Other applications of the driver include acting as an interface between low and high supply voltage circuits either on the same die or in separate IC packages. Referring back to FIG. 1, it can be seen that the pad 122 may also provide an incoming receive signal to the VLSI logic, when the driver is not transmitting, through the receive transistor 132. The transistor 132 operates as a half pass gate and may be biased the same as transistor 116, through node 127. The transistor 132 steps down the high voltage digital signal at node 121 from $V_{ddh}$ down to near $V_{ddl}$ which is low enough for the logic 104 to handle reliably. Note that the logic 104 may be operated between $V_{ddl}$ and $V_{ss}$ generally.

To summarize, various embodiments of the invention have been described that are directed to a MOS driver having improved protection against high voltage signals at its output node. A goal is to weakly bias the gate of the common gate cascode output stage during receive mode, and take advantage of capacitive coupling between the gate and the driver output node, to avoid gate oxide overstress. This functionality is achieved by a protection circuit shown in a particular embodiment as including a MOSFET, a diode, and a resistor. However, other protection circuits can be implemented to provide the same functionality. Moreover, the cascode output stage comprising transistors 112,114,116, and 118 can be made entirely of standard gate thickness P and N channel devices, or they may feature specially designed thick gate devices. Certain embodiments of the invention can allow maximum overshoot above $V_{max}$ at node 121 to be $V_{max}-V_{ddh}+V_{clamp}+V_{range}$ where $V_{range}$ is $|V_t|$ of the transistor 126 in the example and $V_{max}$ is the smaller of the maximum allowable drain to source voltage of the transistor 116 or transistor 114. The maximum undershoot below $V_{ss}$ may be $-(V_{max}-V_{clamp}+V_{range})$, where $V_{range}$ is now $V_{diode}$ in the example. Thus, for instance, if $V_{max}$ is equal to $V_{clamp}$ which is equal to $V_{ddl}$, and $V_{ddh}$ is equal to twice $V_{ddl}$, then the lowest permissible voltage at the output node is $|V_t|$ below $V_{ss}$, and the highest permissible voltage is $|V_t|$ above $V_{ddh}$. By offering protection against undershoot and overshoot that may be less than $|V_{diode}|$, this embodiment of the invention may be particularly suitable for very low supply voltage applications of 1.8 volts and less.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:

a driver having
   a cascode stage with a first common-gate transistor to provide an output transmit signal at a driver output node, and
   a protection circuit including a resistor coupled to bias a gate of the first common-gate transistor to a clamp voltage, the resistor having a resistance value at least large enough to allow the gate voltage to follow some of a transition in the driver output node voltage when the driver is not transmitting.

2. The apparatus of claim 1 wherein the resistor is adapted to delay the gate voltage from returning to the clamp voltage following the transition, so that the voltage between the gate and a source of the first common-gate transistor does not reach a level that can damage the first common-gate transistor.

3. The apparatus of claim 1 wherein the driver further comprises:

a voltage level translator to receive a first transmit signal having a first voltage range and in response generate a first translated transmit signal, the cascode stage being further coupled to receive the first translated transmit signal and in response provide the output transmit signal having a second voltage range greater than the first voltage range.

4. The apparatus of claim 3 further comprising:

very large scale integration (VLSI) logic built on the same die as the driver and coupled to generate and feed the first transmit signal to the driver.

5. The apparatus of claim 4 wherein each of a plurality of MOSFETs in the driver has a gate-oxide thickness that is the same as a standard gate-oxide thickness of any MOSFET in the VLSI logic.

6. The apparatus of claim 4 wherein the VLSI logic implements a processor.

7. The apparatus of claim 4 further comprising:

a pad formed in the die and coupled to receive the output transmit signal from the cascode stage and provide a receive signal to the VLSI logic.

8. The apparatus of claim 7 further comprising:

an integrated circuit package containing the die in which the VLSI logic, the driver, and the pad are built, the pad being coupled to an external terminal of the package.

9. The apparatus of claim 7 further comprising:

a receive transistor coupled between the pad and the VLSI logic and having a gate coupled to the gate of the first common-gate transistor.

10. The apparatus of claim 1 wherein the protection circuit further comprises a clamp coupled to prevent the gate voltage of the first common-gate transistor from dropping below an amount less than the clamp voltage, during the transition.

11. The apparatus of claim 10 wherein the clamp includes a diode coupled between the gate of the first common-gate transistor and a first supply node, to limit the gate to no lower than a diode drop less than the voltage of the clamp voltage, during the transition.

12. The apparatus of claim 11, wherein the cascode stage is coupled between a second supply node and a return node, the second supply node to receive a supply voltage that is greater than that of the first supply node.

13. The apparatus of claim 12 wherein the voltage at the second supply node is no more than twice that of the first supply node, as compared to the voltage at the return node.

14. The apparatus of claim 1 wherein the protection circuit of the driver further comprises:
a pass transistor coupled in parallel with the resistor to bias the gate of the first common-gate transistor, more strongly than can the resistor, to enable transmission through the cascode stage.

15. The apparatus of claim 14 wherein the pass transistor includes a p-channel MOSFET having a threshold voltage Vt, the gate of the first common gate transistor being limited to a level equal to the clamp voltage plus Vt, during the transition.

16. The apparatus of claim 1 further comprising:
a capacitor coupled between the gate and drain of the first common-gate transistor.

17. The apparatus of claim 1 wherein the cascode stage further comprises a second common-gate transistor complementary to the first common-gate transistor and having a gate coupled to the gate of the first common-gate transistor.

18. An apparatus comprising:
a driver having
means for translating a transmit signal having a first voltage range to generate a first translated transmit signal,
means for amplifying the first translated transmit signal to generate an output transmit signal having a second voltage range greater than the first voltage range, the amplifying means having a common-gate transistor to provide the output transmit signal at a driver output node,
means for weakly biasing a gate of the common-gate transistor to a clamp voltage when the driver is not transmitting, and
means for strongly biasing the gate when the driver is transmitting.

19. The apparatus of claim 18 wherein the clamp voltage is approximately a first supply node voltage, and the driver further comprises:
means for preventing the gate voltage from dropping below an amount less than the clamp voltage.

20. The apparatus of claim 19 wherein the preventing means can limit the gate to no lower than a diode drop less than the clamp voltage.

21. The apparatus of claim 18 further comprising:
means for generating the transmit signal, coupled to feed the transmit signal to the driver when transmitting.

22. The apparatus of claim 18 wherein the first translated transmit signal has essentially the same range as the transmit signal.

23. The apparatus of claim 18 further comprising:
means for generating a second translated transmit signal based upon the transmit signal; and
means for amplifying the second translated transmit signal to generate the output transmit signal.

24. A method comprising:
translating a first transmit signal having a first voltage range to generate a first translated transmit signal;
amplifying the first translated transmit signal to generate an output transmit signal having a second voltage range greater than the first voltage range using a cascode stage, the cascode stage having a common-gate transistor whose source provides the output transmit signal while transmitting; and,
when not transmitting through the cascode stage, weakly biasing a gate of the common-gate transistor to allow the gate voltage to follow some of a transition in the source voltage.

25. The method of claim 24 wherein the gate of the common-gate transistor is biased so as to delay the gate from returning to the clamp voltage following the transition, so that the voltage between the gate and the source does not reach a level that can damage the common-gate transistor during the transition.

26. The method of claim 24 further comprising:
preventing the gate voltage of the common-gate transistor from dropping below an amount less than the clamp voltage, during the transition to a lower voltage.

27. The method of claim 26 wherein the amount is a diode drop.

28. The method of claim 24 further comprising:
strongly biasing the gate of the common-gate transistor while transmitting, to enable transmission through the cascode stage.

29. The method of claim 24 further comprising:
preventing the gate voltage of the common-gate transistor from rising above an amount more than the clamp voltage, during the transition to a higher voltage.

30. The method of claim 29 wherein the amount is a threshold drop.

* * * * *

UNITED STATES PATENT AND TRADEMARK OFFICE
CERTIFICATE OF CORRECTION

PATENT NO.     : 6,396,326 B1
DATED          : May 28, 2002
INVENTOR(S)    : Chang It is certified that error appears in the above-identified patent and that said Letters Patent is hereby corrected as shown below:

<u>Title page,</u>
Illustrative Figure, delete the drawing of Figure 1 and insert drawing for Figure 1, attached.

<u>Drawings,</u>
Delete the informal drawings of Figures 1 through 7 and insert the formal drawings for Figures 1 through 7, attached.

Signed and Sealed this

Twelfth Day of November, 2002

Attest:

Attesting Officer

JAMES E. ROGAN
Director of the United States Patent and Trademark Office